United States Patent [19]
Chen et al.

[11] Patent Number: 5,272,397
[45] Date of Patent: Dec. 21, 1993

[54] BASIC DCVS CIRCUITS WITH DUAL FUNCTION LOAD CIRCUITS

[75] Inventors: Imin P. Chen, Austin, Tex.; James W. Davis, Delray Beach, Fla.; Robert M. Swanson, Austin, Tex.; Nandor G. Thoma, Austin, Tex.; David M. Wu, Austin, Tex.

[73] Assignee: International Business Machines Corp., Armonk, N.Y.

[21] Appl. No.: 858,790

[22] Filed: Mar. 27, 1992

[51] Int. Cl.$^5$ .............................................. H03K 19/20
[52] U.S. Cl. .................................. 307/452; 307/455; 307/468
[58] Field of Search .............................. 307/451–452, 307/455, 465–469; 371/22.3

[56] References Cited

U.S. PATENT DOCUMENTS

| | | | |
|---|---|---|---|
| 4,513,283 | 4/1985 | Leininger | 307/455 |
| 4,535,467 | 8/1985 | Davis et al. | 307/272.1 |
| 4,686,392 | 8/1987 | Lo | 307/455 |
| 4,698,830 | 10/1987 | Barzilai | 307/465 |
| 4,760,289 | 7/1988 | Eichelberger | 307/455 |
| 5,166,547 | 11/1992 | Babakanian et al. | 307/465.1 |

*Primary Examiner*—Edward P. Westin
*Assistant Examiner*—Andrew Sanders
*Attorney, Agent, or Firm*—Winfield J. Brown, Jr.; Robert Lieber

[57] ABSTRACT

Disclosed is a basic DCVS (differential cascode voltage switch) tree construct, which can be used as a uniform basis for constructing DCVS logic circuits, register-latch circuits and circuits which can be conditioned individually to function as either or both DCVS logic and register-latches. In addition to logic and load sections that may be identical to corresponding sections of prior art DCVS trees, this construct contains gating elements for providing unique functions of isolation, precharge support and latch input coupling. The isolation function is used to electrically isolate the logic and load sections from each other, so that each section can be made to operate in a mode which is independent of the other section. The precharge support function allows precharging of circuits in the logic section without involvement of the load section. The latch input coupling function allows signals to be applied to and latched in the load section from a source other than the respective logic section. Use of arrays of such trees for constructing complex logic circuits is described.

12 Claims, 5 Drawing Sheets

W = Write
PC = Precharge
V = Validate

BASIC DCVS CIRCUITS WITH DUAL FUNCTION LOAD CIRCUITS

FIELD OF THE INVENTION

This invention relates to Differential Cascode Voltage Switch (DCVS) circuits.

BACKGROUND OF THE INVENTION

DCVS circuits are logic circuits implementable in today's CMOS (complementary metal oxide semiconductor) technology. As described in U.S. Pat. No. 4,570,084 to W. R. Griffin et al, such circuits may be formed out of arrays of many "trees" units (hereafter termed "trees"), each tree performing an elementary logical function. Each tree receives a number of binary data input signals, and generates a binary output data signal that represents a predetermined logical function of its inputs. In each tree, this function may be any one of many possible functions.

A tree generally contains two discrete circuit sections; a logic section and a load section. Each section contains pairs of switch elements having complementary associations and requiring the logic section to receive true and complement phases of each input signal simultaneously. Since each tree output may be applied to inputs of other trees, the load section must generate true and complement phases of the output signal simultaneously.

Inputs to any tree originate as outputs of other circuits (other trees, and/or other non-DCVS circuits on the same chip, and/or off-chip sources), and output of any tree is transferable as a data input to other circuits (other trees and/or other non-DCVS circuits on the same chip or off-chip circuits).

Arrays of many trees may be formed into sophisticated logic circuit devices (e.g. parallel adders, state machines, etc.). Operations of such arrays are controlled by discretely phased clock signals which alternately induce precharge and validation effects in the individual trees. During precharge, a pair of circuit nodes in the tree charge to a reference potential. During validation one of these nodes discharges, depending upon the immediate states of data inputs to the respective logic section. Potentials at the charged and discharged nodes establish the complementary phases of the tree output data signal. These potentials are transiently latched by the load circuit until the next precharge.

In constructing a DCVS circuit device, a semiconductor chip is processed to form basic configurations of many "unpersonalized" trees (switch elements without connections defining their logical interaction), and circuit connections are formed in and between the trees to establish the logical personality (functions) of the trees and the device. These connections power the tree circuits and carry data signals to and between trees.

A desired objective has been to make such unpersonalized configurations and their processes of personalization so uniform and simple that they can be handled in a manner analogous to the way in which today's gate arrays are made. This would permit a single unpersonalized configuration to be used as a common element in construction of many different types of circuit devices, and also would simplify the design and development of customized devices.

A problem with "gate array" handling of prior art DCVS tree arrays is the requirement to provide latch circuits between trees, at array positions which may vary according to specific logic requirements (i.e. at positions which are not predeterminable or even easily determinable). Some latch circuits may be needed to synchronize data flow between groups of trees (refer for instance to U.S. Pat. No. 4,615,010 to J. W. Davis et al). Others may be needed as shift register latch (SRL) elements to facilitate testing of trees (this is disclosed in co-pending US patent application by J. Babakanian et al Ser. No. 07/711,466—hereafter, the Babakanian et al '466 application—filed Jun. 5, 1991 and assigned to the assignee of the present application).

A problem with the placement of such latch circuits on a densely populated chip is that these circuit tend to alter the symmetry of the logic tree array, and thereby tend to complicate the design of DCVS circuits in "gate array" fashion. Also, some latches do not perform any logical function, and occupy space that otherwise could be serving a logical purpose.

The present invention seeks to overcome these prior art limitations by providing a basic tree structure that can be configured in uniform arrays, and adapted at any array coordinates to perform logic and/or latching functions.

OBJECTS OF THE INVENTION

An object of the present invention is to define a basic tree construct which can be used as a common basis for forming many different types of DCVS circuits.

Another object is to provide a basic tree construct which can be placed on a chip in a uniform array, and adapted at any array coordinate to provide signal latching capabilities without affecting the uniformity of the array.

Another object is to provide a basic tree construct which can be placed on a chip in uniform arrays containing many such constructs, and adapted at any array coordinate to provide either a logic function or a latching function, or both functions, without affecting the uniformity of the array.

Another object is to provide a basic tree construct for making DCVS circuits, such that multiple trees constructs of similar form can be placed on a chip in a uniform array and such that individual tree constructs can be selectively modified to perform logic functions, signal latching functions, or both functions, without affecting the uniformity or spacing of the array.

Another object is to provide a novel tree construct that can be easily adapted to operate as: (1) a DCVS tree logic unit, (2) a register latch circuit, or (3) both a DCVS tree logic unit and a register latch circuit.

Another object is to provide a novel method for constructing DCVS circuits.

Another object is to provide tree constructs serving as a basis for designing and constructing DCVS circuits in "gate array" fashion, and which are adaptable when arrayed with a given symmetry to provide signal latching capabilities at any tree position without altering that symmetry.

Another object is to provide circuits adaptable to form DCVS logic trees which are also easily adaptable to provide signal latching functional capabilities.

Another object is to provide a DCVS tree construct which can be operated as both an elementary logic circuit and a shift register latch, so that any complex DCVS circuit containing many such trees can be diagnostically scanned at a level permitting observation of transient logical states of individual trees.

Another object is to provide a basic tree circuit which can be operated as both a DCVS logic tree and a shift register latch, so that DCVS circuits containing many such tree circuits as logical components can be assembled in a "fully testable" form in which transient states of individual trees can be statically latched for diagnostic observation purposes.

SUMMARY OF THE INVENTION

The foregoing and other objects are realized by providing a tree construct which contains relatively isolatable logic and load sections. Isolating switch elements between the sections can be operated to allow each section to function independently of the other. Additional switch elements in the logic section permit that section to be precharged while it is isolated from the load section. Additional switch elements associated with the load section permit that section to receive and latch signals originating outside of the respective tree (e.g. signals generated as outputs by another tree).

When the two sections are not isolated, this construct operates as the equivalent of any prior art DCVS tree; with signals resulting from validation of the logic section being directly coupled to and latched as transient signal outputs of the load section. When the sections are isolated, signals originating as transient outputs of another tree load section (or another signal source that is not a tree) may be received and latched by the load section. Thus, with appropriate interconnections and clocking, an array of many trees can be logically exercised and their load sections can be made to operate as a shift register relative to signals representing transient logical states attained during the exercise; i.e. the transient states of individual trees can be scanned out shiftably for direct external observation and diagnostic analysis.

More generally, the present tree construct is adaptable to provide functional capabilities of: (1) performing elemental logic operations equivalent to those obtainable from any prior art DCVS logic tree unit; (2) performing signal latching and storage operations comparable to those obtainable from any prior art latch or register latch circuit; or (3) perform both elemental logic and register latching operations in a dynamic manner.

These and other features, effects, advantages and benefits associated with the present invention may be more full understood and appreciated by considering the following description and claims.

DESCRIPTION OF THE DRAWINGS

FIG. 1 A is an example of a prior art logic section which is arranged to perform an exclusive-OR logic function on four pairs of data input signals.

DETAILED DESCRIPTION OF THE INVENTION

1. Prior Art DCVS Tree Circuits

Figures 1, 1A:
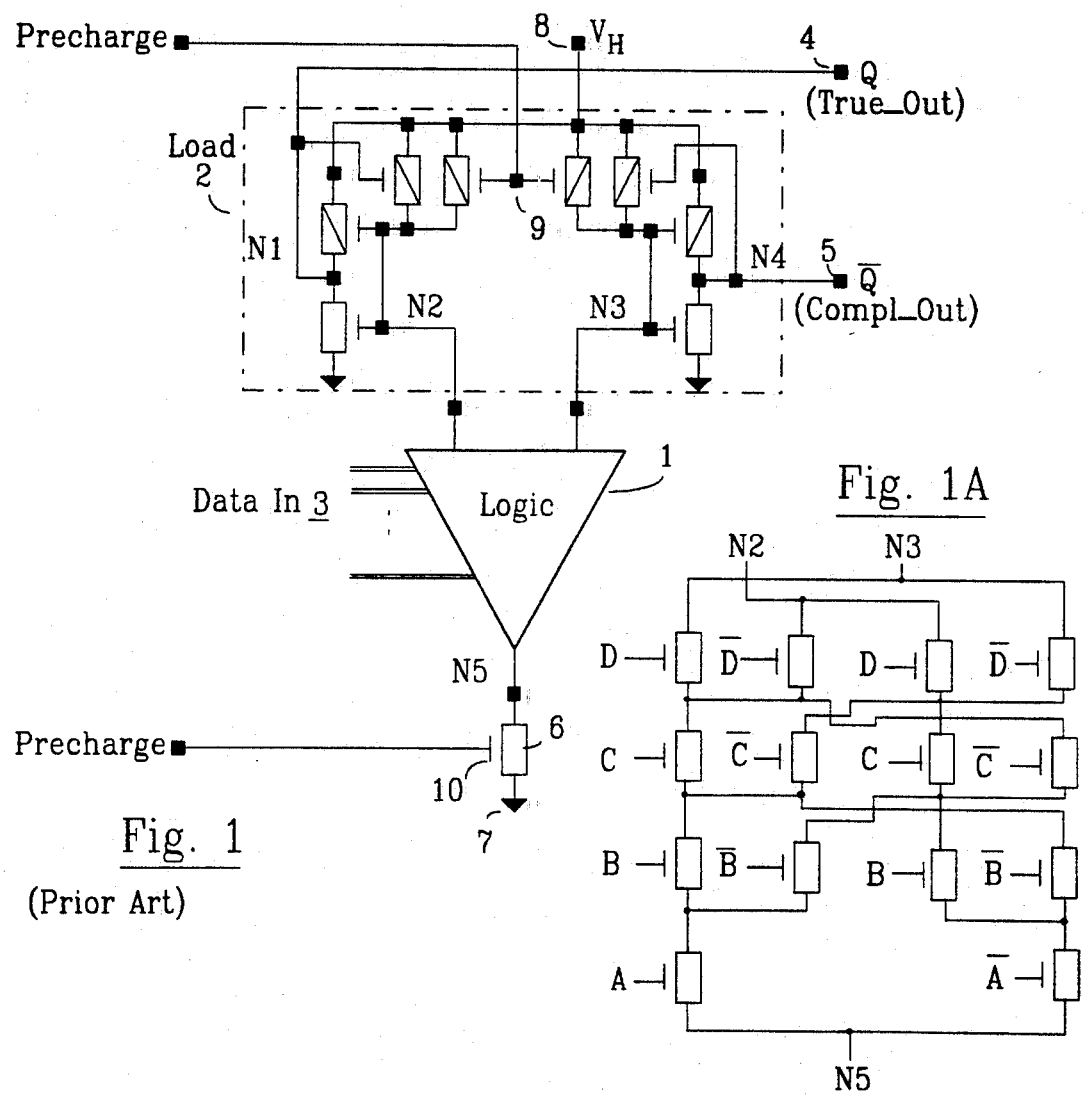
FIG. 1 is a schematic of a prior art DCVS tree unit circuit, having a logic section and a load section, the latter operable only to latch signals developed by the logic section.

As shown in FIG. 1, a typical prior art DCVS tree consists of a logic section 1 and a load section 2. Each tree may be a component in an assembly or array of many interconnected trees arranged in a uniform manner on a semiconductor chip. The trees in such arrays may have individually personalized internal conductors and switches enabling them to perform different (elementary) logical functions, and connections between the trees establish the logical personality or function of the assembly as a logical circuit or device.

When fully personalized and operating, logic section 1 receives pairs of binary signal inputs 3 and interacts with load section 2 to generate a pair of output signals at 4 and 5. Each input signal pair represents true and complementary phases of a binary signal function, and the output pair at 4 and 5 represent true and complement phases of a binary signal function Q (phases Q and "not" Q) having a predetermined logical relationship to the inputs. This relationship may be any one of many relationships depending upon the tree personalization. Inputs to each tree may be outputs of other trees or other circuits (e.g. non-DCVS circuits outside of the DCVS tree array), and the output 4, 5 of any tree may be transferred in parallel as inputs to other trees or other circuits (e.g. non-DCVS circuits outside the array of trees).

FIG. 1A illustrates a logic section personalized to generate an output representing the "Exclusive-Or" of four complementary pairs of inputs (A, "not" A, B, "not" B, C, "not" C, and D, "not" D) 1A. This circuit is well known, and corresponds to FIG. 3 in the previously cited U.S. Pat. No. 4,570,084 to W. R. Griffin et al.

Referring again to FIG. 1, load section 2 contains P and N type active semiconductor gating elements, indicated respectively by rectangles with and without diagonal lines drawn inside them. Logic section 1 contains only N type active semiconductor gating elements. Five signal nodes are specifically labelled N1-N5, to aid in describing operation of this circuit. Nodes N1-N4 are in the load section and node N5 is at the bottom of the logic section. N1 and N4 connect directly to the outputs at which Q and not Q are respectively presented.

N5 connects to the collector of N type element 6 which has its source tied to ground at 7. All P type elements in the load section have their sources tied to positive DC voltage $V_H$ shown at 8. A "precharge" clock signal, applied at 9 to control electrodes of two P type elements in the load section and at 10 to the control electrode of element 6, alternates cyclically between low (ground) and high ($V_H$) potentials alternately inducing precharging and validation effects in the logic section.

When the clock is low (precharge), the gates controlled at 9 conduct, transferring $V_H$ to nodes N2 and N3. At the same time, the low potential at its control electrode prevents gate 6 (and all gates above it in the logic section) from conducting. Accordingly, nodes N2 and N3 charge to $V_H$ (e.g. through distributed capacitances in the logic section). The positive potentials at N2 and N3 make the N type gates in the load section conduct and thereby transfer low (ground) potential to both output nodes N1 and N4.

When the clock goes high (validation), gate 6 conducts allowing the charge at one of the nodes N2 or N3 to discharge (through those gates in the logic section which currently have positive inputs). The lowered potential at the discharged node causes the potential at the associated output node, N1 or N4 to rise. Accordingly, during validation, complementary potentials (high and low) appearing at the output nodes represent the true and complement phases of the logical output of the respective tree.

The foregoing operations are described in greater detail in the referenced U.S. Pat. No. 4,570,084.

Figure 2:
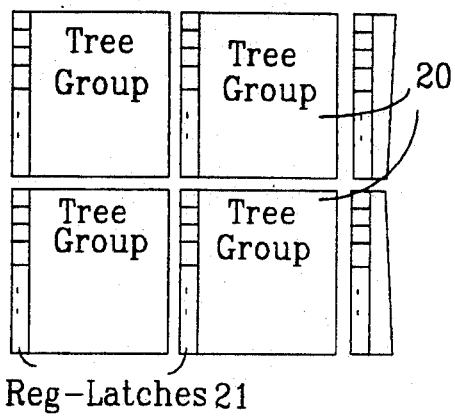
FIG. 2 is a schematic illustrating a prior art layout of groups of DCVS tree units, suitable for forming discrete logic partitions in a complex device, with specialized register latch circuits at interfaces between groups.

FIG. 2 shows a prior art "testable" configuration of partitioned groups of DCVS tree circuits of the type described in the referenced Babakanian et al '466 application. Each group contains DCVS trees 20 and source signal latch circuits 21. There may be many trees 20 and latches in each group (in general, more trees than latches), and each tree may have the form typified in FIG. 1.

Although only two groups are shown, it should be understood that a complex circuit (e.g. a 16 bit parallel adder) would contain many more groups. Furthermore, although not shown, it should be understood that each group may include connections for transferring data signals (signals generated by normal logical operations of the respective group) from: (a) load outputs of trees 20 to logic inputs of other trees 20; (b) load outputs of trees 20 to external circuits (e.g. inputs of latches 21 in other groups); (c) outputs of latches 21 to logic inputs of trees 20 in the same group; and (d) external sources (e.g. load outputs of trees 20 in other groups) to inputs of latches 21.

As explained in the Babakanian et al '466 application, this type of arrangement operates in "normal" and "test" modes. In normal mode, latches 21 serve as logic signal buffers between external circuits (e.g. load outputs of trees 20 in other groups) and inputs of trees 20 in the associated group. In test mode, latches 21 are operated as a shift register to scan test data signals (supplied serially from an external source) to inputs of trees 20 in associated groups. This permits the group circuits to be tested in accordance with well-known LSSD (level sensitive scan design) test procedures described in a paper by E. B. Eichelberger et al ("A Logic Design Structure For LSI Testability", Proceedings of the 14th Design Automation Conference IEEE, 1977, Pages 206-215).

More specifically, in test mode, a pattern of test data signals is scanned into a first shift register formed by latches 21, and the groups are then exercised in normal mode for a determinable number of (precharge/validate) clock cycles. This causes the test data in latches 21 to be applied (in parallel) to inputs of trees 20 in associated groups. At the end of this exercise, outputs of trees 20 are scanned out (through other circuits not shown here) for diagnostic evaluation.

Figure 2A:
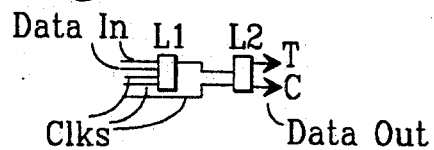
FIG. 2A illustrates a specific prior art shift register latch (SRL) circuit used for data bit shifting operations.

As explained in Babakanian et al '466, each latch 21 may be a shift register latch (SRL), having the form shown in FIG. 2A, including interconnected "master and slave" latching stages L1 and L2.

In normal mode, inputs of L1 stages of the latches receive data representing logical outputs of other circuits (including trees in other groups) accompanied by "C" clock signals causing the data to be latched into the L1 stages. The same data is passed from L1 stages to L2 stages of respective latches by "B" clocks that are offset in phase from the C clocks. Data in the L2 stages are transferred to inputs of trees 20 in associated groups, while new data is being captured in the L1 stages.

In test mode, outputs of L2 stages of the latches are connected to inputs of L1 stages of other latches to form a shift register chain. Test data is serially applied to the L1 stage of a first latch in this chain (from a source external to the DCVS circuits), and passed through the L2 stage of that latch to the L1 of a second latch in the chain, passed through the L2 stage of that latch to L1 of a third latch, and so forth (through all of the latches 21), until a desired pattern of test signals has been staticized in the latches for a test exercise.

When a test pattern is so staticized, the latches and trees are clocked in normal mode for a predetermined number of cycles, in which the trees are alternately precharged and validated, causing logic signals to propagate from latches to tree inputs in the associated group, from tree outputs to other tree inputs in the same group, and from tree outputs to latches of other groups, in accordance with the logical personality of the array of all groups. Other circuits not shown in FIG. 2 (but described in Babakanian et al '466) permit states of the trees 20 resulting from such operations to be scanned out to external circuits for diagnostic evaluation.

As explained in Babakanian et al '466, because tree states within any group are diagnostically observable, data transfers between groups (from trees of any group to latches 21 of other groups) can be handled over "single rail" connections (one wire per bit), thereby reducing the number of conductors needed between groups, without loss of operational integrity in the circuit formed by the groups.

A problem solved by the present invention is understood by noting that grouping of trees 20, and positioning of associated latches 21 and associated not-shown circuits for diagnostic scanout, are dependent upon the logical organization of the circuit to be formed by the groups. Thus, different logical functions may require grouping of trees, and therefore different positioning of latches 21 and diagnostic scanout circuitry that are associated with the groups.

This of course makes the design of such circuits more complex and therefore more costly; as even a small change to an existing logical configuration may require changes to the positioning and associations of latches 21 and the not-shown scanout circuitry, requiring a new topological layout of trees and latches and associated new manufacturing elements (masks, etc.).

Also, since such configurations have relatively fixed forms, chip space allocated to the latches and scanout circuitry in each configuration is unavailable for performing logic functions of tree circuits that otherwise could increase the overall logical functionality or scope of the circuits.

These limitations are avoidable by using the "universal" (or dual function) tree unit arrangement of the present invention, as described next. Arranged in multiple, in a uniform array, such units are modifiable to establish logic group functions equivalent to those of trees 20 at any positions in the array, and latching functions equivalent to those of latches 21 at any other positions in the same array, without having to change the overall topology of the array or the relative positions of any of its unit constituents. Furthermore, the units described next integrally contain components that permit transient states of those units which are configured as logic trees to be latched and subsequently scanned out for diagnostic evaluation; thereby eliminating the need for additional components to be inserted between trees or tree groups for that purpose.

2. Tree Unit In Accordance With Present Invention

Figure 3:
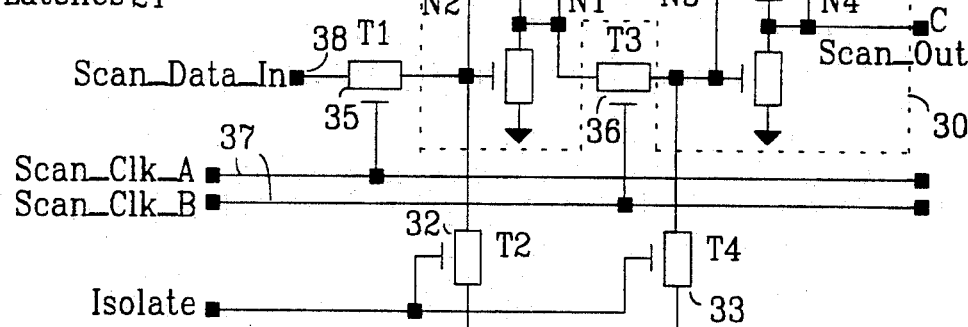
FIG. 3 is a schematic showing the basic elements of a DCVS tree unit constructed in accordance with the present invention.
Figure 3:
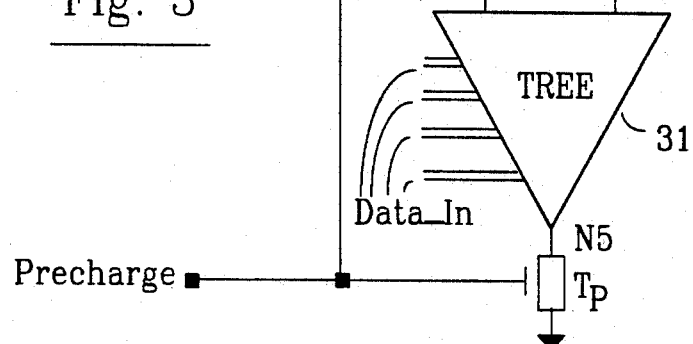
Figure 7:
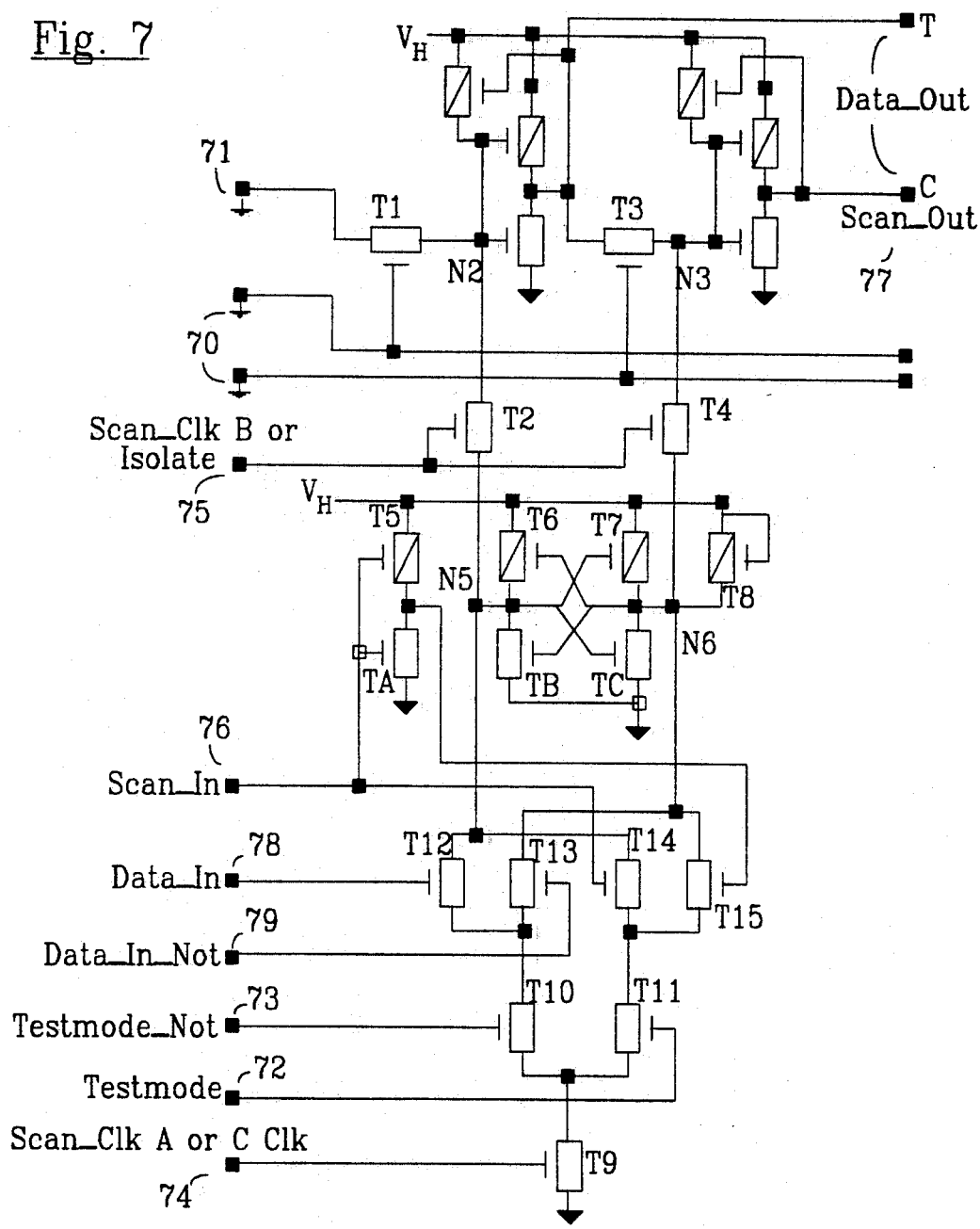
FIG. 7 is a schematic of a DCVS tree unit in accordance with the invention to illustrate a wiring pattern that could be used to personalize such a unit to function only as a Shift Register Latch (SRL).

As shown in FIG. 3, a basic tree unit in accordance with the present invention includes load and logic sections, 30 and 31 respectively, a precharge gate $T_p$ (corresponding to gate 6 in FIG. 1, and additional elements 32-36 responsible for novel aspects of its use. This unit can perform logic and statically latch logical data signals (e.g. for diagnostic evaluation). A modification of this unit that is shown in FIG. 7 (and described later) is used for test data shifting and other special purposes.

N-type elements 32 and 33 ("transistors" T2 and T4 respectively) are positioned between the sections as isolation switches. These elements are controlled by "Isolate" signals. When Isolate is low (e.g. grounded), these switches are effectively "open" and isolate the sections from each other; so that each section can function without affecting the other (e.g. as described later, the load section can receive and latch signals originating outside of the respective unit, and the logic section can be precharged and/or validated without affecting signal states in the load section). When Isolate is high (e.g. at $V_H$), the sections are coupled (so that signals developed by validation of the logic section are transferred to nodes N2 and N3 in the load section and thereby latched at output nodes N1 and N4 of that section.

P-type gates T5-T8, shown at 34, are controlled by the Precharge clock (which in FIG. 1 controls gates in the load section). Gates 34 allow precharging, validation and transient latching of the logic section output while that section is isolated from the load section; i.e. these gates function as the equivalent of some of the P-type gates in the load section of FIG. 1.

Elements 35 and 36 (N-type gates T1 and T3) are controllable by phased Scan Clock signals applied to lines 37 (Scan_Clk_A and Scan_Clk_B), when the sections are isolated from each other, to latch externally originated data signals Scan_In presented at input terminal 38 of element 35. As described below, signals at 38 may be shifted from the output of another unit's load section, whereby logical states statically latched in multiple units of this type can be scanned for diagnostic evaluation. When Scan_Clk_A is high, data at input 38 is transferred through T1 and latched at N1. When Scan_Clk_B is high (at a phase staggered from the high phase of Scan_Clk_A) data latched at N1 is transferred through T3 and latched as "Scan_Out" data at output node N4 (from which it can be transferred to the input 38 of another load section or a circuit or device for performing diagnostic evaluation).

Note that with this arrangement, signals shifted through T1 and T3 may produce identical output states at N1 and N4, which therefore can not be used as (true and complement) inputs to any tree logic section. Therefore it is understood that signals shifted through T1 can not be applied as logical input data to any tree in the same manner as the SRL circuit 21 of FIG. 2 (where the L2 stage has outputs that are proper complements of each other). However, as shown below, the isolate capability allows signals transiently latched during validation of the logic section to be statically latched in the load section, and the Scan coupling allowed by T2 and T4 permits the statically latched states of many such units to be serially scanned for diagnostic evaluation.

In general, the added switch elements T1-T8 as shown in FIG. 3 allow the respective tree circuit to be operated dynamically in any of the following modes: (1) as the functional equivalent of any prior art DCVS tree (i.e. with T2 and T4 conductive); and (2) as a shift register latch useful for statically latching transient states of both the respective tree unit and other tree units, whereby such transient states may be diagnostically observed in direct correlation to their tree origins. The latter function is important; e.g. because it allows for direct observation of circuit and/or mask design flaws, within arrays of many densely packaged trees, which otherwise could be very difficult and costly to pinpoint.

Figure 4:
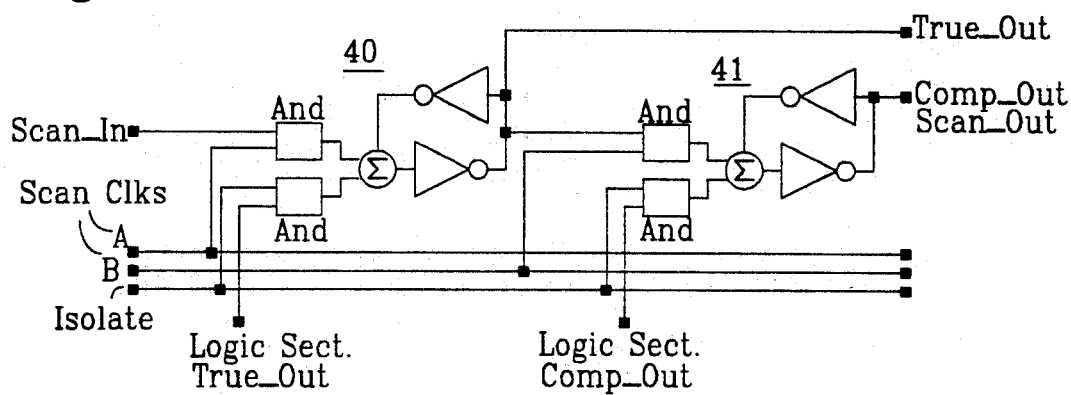
FIG. 4 is a schematic for illustrating the logical circuit equivalent of the load circuit section in FIG. 3.

FIG. 4 shows the logical circuit equivalent of the load section in FIG. 3. Latching circuits 40 and 41 correspond to the latching stages in FIG. 3 that are respectively associated with T1 and T3 (i.e. with the stages that respectively couple to the True and Complement outputs of the unit). And circuits in stage 40 are individually controlled by Scan_Clk_A and the Isolate control signal. And circuits in Latch stage L2 are individually controlled by Scan_Clk_B and the Isolate control signal. As noted earlier, Scan_Clk_A and Scan_Clk_B are supplied only while Isolate is effective (i.e. low or in isolating condition). When Isolate is ineffective (high), the Scan_Clk's are suppressed.

Thus, when Isolate is high, And circuits in stages 40 and 41 respectively (and simultaneously) transfer true and complement data signals to respective stages, those signals representing data transiently generated by validation of the associated logic section. The latched outputs thereby appear at the true and complement output nodes (T and C) as data that can be applied as input data to logic sections of other units. And when Isolate is low, and the A and B scan clocks are therefore unsuppressed, signals presented at "Scan_In" (e.g. from the load section of another tree unit) are successively latched in stages 40 and 41, and transferable from the latter stage to the Scan_In terminal of another unit (or to a diagnostic evaluation circuit). Thus, by appropriate interconnections between Scan_Out terminals of load sections and Scan_In terminals of other load sections, the load sections in all tree units (in an array of many units) may be operated as a shift register for presenting a static version of their transient states for diagnostic observation.

3. Circuits Using The Subject Tree Unit

Figure 5:
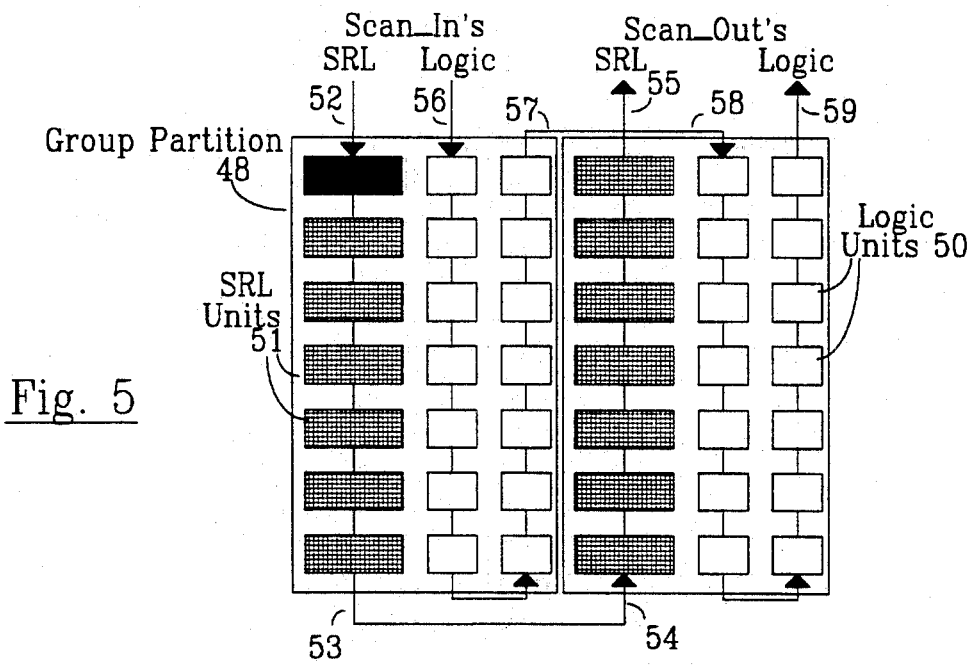
FIG. 5 is a schematic illustrating a layout of DCVS units in accordance with FIG. 3 in discrete partitions, with separate shift connections extending through and between partitions for shifting test data into the partitions and for separately shifting output data out of the partitions as diagnostic information.
Figure 6:
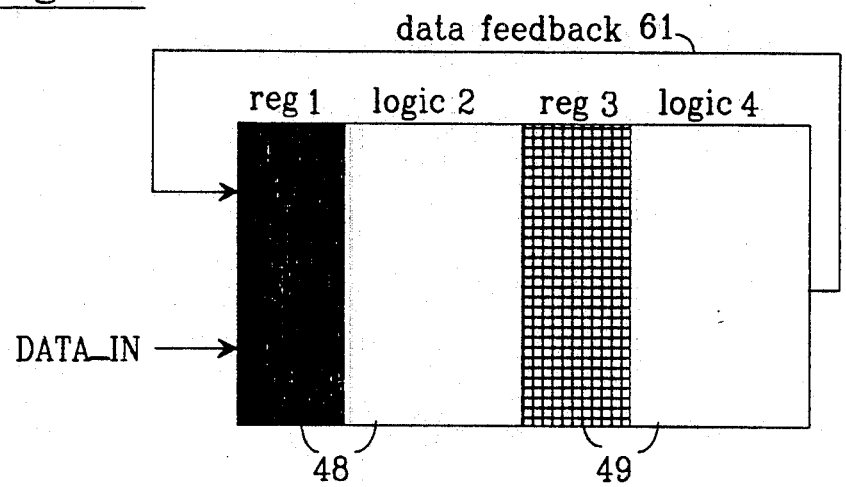
FIG. 6 is a schematic of a layout of two DCVS partitions with logical interconnections for explaining the normal flow of data signals through partitions.

FIGS. 5-7 are used to explain how arrays of basic tree units, of the type shown in FIG. 3 and of certain modifications thereof (described later relative to FIG.

7), can be used to form complex arrays of circuits that can be operated in one mode to perform logic functions and in another mode to support LSSD testing.

FIG. 5 shows logical partitions, 48 and 49, which may be part of a larger DCVS circuit containing other partitions. Each partition contains a group of (usually many) basic DCVS tree units 50, of the type shown in FIG. 3, and modified tree units 51 (of the type shown in FIG. 7 and described later). These units operate in test and normal modes, are interconnected and configured to perform all of the functions that can be performed by the specialized latch and tree group arrangement shown in FIG. 2, and in addition the units 50 are configured to be able to statically latch their own logic states and to perform scan out shifting functions to allow for diagnostic observation of these states.

Trees 50, symbolized by unshaded rectangles, are configured exactly as shown in FIG. 3. Each operates when Isolate is effective (high) to receive complementary input signals and generate a logically related complementary pair of output signals which is latched in the respective load section. When scan clocks are effective, trees 50 operate as a shift register to scan out signals produced as a result of earlier logical operations.

Trees 51, symbolized by internally shaded rectangles, are configured to operate as functional equivalents of the register latch units 21 in FIG. 2; i.e. to buffer data signals in transit between groups during normal mode operations, and to scan in test signals relative to respective groups in test mode operations.

These trees also operate in two modes; a test "scan in" mode and a "normal" latching mode. Trees 51 in all groups are interconnected as a first shift register, having connections relative to partition 48 starting at 52 and ending at 53 and relative to partition 49 starting at 54 (which continues from 53) and ending at 55. Trees 50 are configured as a second shift register, which relative to partition 48 starts at 56 and ends at 57 and relative to partition 49 starts at 58 and ends at 59.

In test mode, test signals originating outside of the partitions are shifted through the first shift register to form a predetermined pattern of (complementary pairs of binary) test signals relative to all partitions. Then the units are operated in normal mode, to exercise the logical functions of all units 50 from an initial state represented by the shifted pattern. After a predetermined number of normal mode cycles, data latched in the second shift register formed by units 50, and representing a static image of an instantaneous transient state of all units 50, is shifted out for (external) diagnostic observation.

For normal mode operation, each unit 51 has not-shown output connections to logic sections in one or more units 50 in the associated group, and not-shown input connections from an external source (e.g a load section of a tree 50 in another partition, or a non-DCVS circuit). In normal mode operation, complementary data signals are transferred in pairs through and between partitions over the not-shown connections between units 50 and 51, and over not-shown connections within each group between load sections of units 50 in the group and logic sections of other units 50 in the same group.

Aside from use of presently-disclosed "dual function" tree structures to implement logic and latching functions, including diagnostic scan-out, such arrangements of DCVS logic and latching circuitry are generally disclosed in the Babakanian et al '466 application.

Although units 50 and 51 are shown symbolically by rectangles of different size in FIG. 5, it should be noted that in general they all would have the same physical size (in terms of areas of chip surface occupied by each unit).

Also, although units 51, which are used only as SRL circuits, may contain more active elements than a simple SRL circuit (see FIG. 2A), the chip space occupied by the additional elements can be shown to be relatively insignificant by comparison to the parts inventory capabilities afforded by the uniformity of arrays containing only the present type units; since units such as 51 and 50 can be selectively formed anywhere within such arrays without altering the unpersonalized topology of the array (whereas a configuration of prior art SRL circuits once positioned on a chip becomes a design factor potentially limiting applications of that chip as a stock part).

Furthermore, the dual use capabilities of trees 50, as both logic and diagnostic scan out latches, provides a diagnostic capability of observing array faults at the level of individual trees; which transcends in benefits the increased circuit count of units 50 compared to comparable prior art trees, and more than offsets any disadvantage in respect to increased circuit count in units 51. It should be noted that this diagnostic scan out capability is simply not realizable in prior art tree arrays unless a discrete latch circuit is attached to the output of each tree and positioned not to interfere with or restrict the interconnections between trees.

An additional point to note is that in general, in a partitioned configuration of the type suggested in FIG. 5, the number of units operating as dual function circuits 50 would be significantly greater than the number of units operating as latch-only circuits 51. Accordingly, any increased count of switch elements associated with the units configured as circuits 51 should be greatly offset by the increased functionality of units configured as circuits 50.

The not-shown connections for sustaining normal mode operations of the circuits in FIG. 5 will depend upon the logical functions designed into the trees 50. Some aspects of these connections may be understood by considering FIG. 6 as an "abstraction" of FIG. 5 with shift connections deleted. FIG. 6 may also be viewed in a different context, with units 51 and LSSD test capabilities omitted, and effects and possible advantages of that will be discussed later.

FIG. 6 shows partitions 48 and 49 with shift connections omitted. Part of each partition corresponding to the aggregate of all associated units 51 is shown collectively as one shaded area. These areas are respectively labelled "register 1" in partition 48 and "register 3" in partition 49. Part of each partition corresponding to the aggregate of all associated units 50 is shown collectively as one unshaded area; which is labelled logic 2 in partition 48 and logic 4 in partition 49. Feedback connection 61, from logic 4 to register 1, suggests how data signals circulate between partitions in normal mode operations.

From the prior discussion of FIG. 5, it is understood that registers 1 and 3 each contain multiple units 51, and logic 2 and 4 each contain many tree units 50. Furthermore, it is understood that in normal mode units 50 and 51 respectively operate to perform logic and buffer logical data signals. And it is also understood that in test mode units 51 operate as a first (LSSD) shift register to scan in test signals to associated units 50, and in scan out mode units 50 operate as a second shift register to allow for external diagnostic observation of staticized states of those units which normally are quite transient states.

Although only one data transfer connection 61 is shown in FIG. 6, it should be understood that in general each unit 51 may receive data from a source external to its partition, and transfer data to one or more logic sections of units 50 in its partition.

In normal mode, data enters each partition on the left and leaves it on the right, as viewed in FIG. 6. Entering data is latched in units 51 and transferred to associated units 50. Within the partition, data flows from load section outputs of units 50 to logic section inputs of other units 50. And data leaving the partition flows from load section outputs of units 50 either to units 51 of other partitions or circuits external to the array of all DCVS partitions (e.g. non-DCVS circuits on the same or another chip, or other DCVS arrays on the same or another chip).

It is understood that the logic section of each unit 50 may receive plural data inputs in normal mode, and each undergoes precharge and validation clocking operations as in prior art DCVS circuits.

Figure 6A:
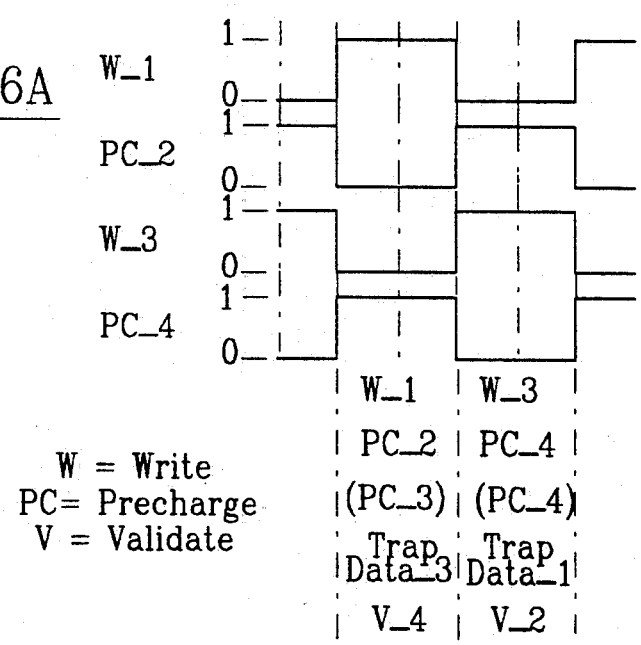
FIG. 6A is a timing diagram for explaining the clocked operation of the partitions shown in FIG. 6.

FIG. 6A shows normal mode clocking of parts shown in FIG. 6. Time flows left to right, and the four waveforms indicate control signals applied to register 1 (W_1, denoting "write 1"), logic 2 (PC_2, denoting "precharge 2"), register 3 (W_3) and logic 4(PC_4). Below the waveforms, in time spaces representing two half-cycles of partition operation, labels indicate the events occurring in the respective half-cycle.

Thus, it is seen that in the first half-cycle data is written to (all units 51 in) register 1 (W_1), (each unit 50 in) logic 2 precharges, data is trapped in register 3 (written to a first stage of each unit 51 in that register) and logic 4 is validated (V_4). The notation "PC_3" in parenthesis does not apply to the configuration as discussed here (but will have relevance in a later discussion). In the next half-cycle, data is written to register 3, logic 4 precharges, data is trapped register 1 and logic 2 validates. Again the parenthetic notation "PC_1" in this phase is not relevant to the present discussion.

Now, consider the arrangement of FIG. 6 in a different context, assuming that logical functions and diagnostic scan-out are required but LSSD type testing is not required. This means that registers 1 and 3 are required only to circulate normal mode data and not test data. In this case, registers 1 and 3 can be formed out of tree units similar to units 50; i.e. they can be precharged and validated and perform logic functions. Then the parenthetic notations in FIG. 6A (PC_3 and PC_1) are seen to have relevance.

A configuration of a basic DCVS unit for "latch only" operation (e.g. for operating as units 51 in FIG. 5) is shown in FIG. 7. Comparing this unit to the one shown in FIG. 3, it is appreciated that this unit and the one in FIG. 3 map topologically into the same amount of space and have roughly similar numbers of switch elements. However, the unit in FIG. 7 does not have a precharge clock (i.e. the switch elements positioned in the areas associated with load and logic sections are tied together as one static circuit).

Transistors T10-T15, corresponding to switching elements which in FIG. 3 would occupy the logic section, operate only to transfer data signals and not manipulate them logically. Transistor T9 corresponds positionally but not functionally to precharge transistor $T_P$ in FIG. 3.

Transistors TB, TC, T6, and T7 collectively perform buffering functions equivalent to those performed by transistors T6 and T7 alone in FIG. 3.

Control electrodes of transistors T1 and T3 are tied to ground as shown at 70, and the signal input to transistor T1 is also grounded as at 71; whereby these transistors can not conduct, and other elements occupying the space associated with the load section can receive signal inputs only through isolation switch elements T2 and T4 (i.e. only from elements in the space associated with the logic section).

Test mode and normal mode operations are controlled by complementary control signals applied at 72 and 73. When Testmode (TM) is high at 72, Testmode_Not (TMN) is low at 73, and when TMN is high TM is low. When TM is high, the unit operates in test mode, and when TMN is high the unit operates in normal mode.

In test mode, Scan_Clk_A at 74 and Scan_Clk_B at 75 are effective and alternate in phase (one is high while the other is low, and vice versa). In this mode, the normal mode control signals, C clock at 74 and Isolate at 75, are not used. When Scan_Clk_A is high, True phase of Scan_In data is received at 76 and latched at node N5. Complement phase of the same data (generated by inversion of the signal phase received at 76) is applied to T15 and latched at N6). When Scan_Clk_B is high (Scan_Clk_A is low), signal states at N5 and N6 are transferred via T2 and T4 to nodes N2 and N3; and from those nodes, to output nodes N1 and N4. One of the signal states at the output nodes—in the illustration, the state at complement output node N4 at 77—is transferred as Scan_In input data to a next shift stage (another unit 51) if there is one.

In normal mode, C clock and Isolate are effective, and the control signals associated with test mode (Scan_Clk_A and Scan_Clk_B) are not used. Data_In (true) and Data_In_Not (complement) phases of input data (typically, data originated in the load section of a tree 50 in another partition) are respectively received at 78 and 79, and respectively latched at N5 and N6 (via T12, and T13 respectively). Isolate is held continuously high, so that data latched at N5 and N6 is immediately transferred to output nodes N1 and N4, respectively.

During diagnostic scan-out, data effectively statically latched in register stages formed by such circuits is shifted out for diagnostic observation by operation of the Scan Clocks A and B that were used for scan-in.

The terms static and transient, as used heretofore to describe the latching operations in the various units 50 and 51, should be understood as connoting relative periods of storage. Assume, for instance, that units of the type described are assembled into multiple partitions forming a high speed parallel adder. Data entered into the adder inputs are logically manipulated into partial results, combined with carry signals generated at intermediate stages and associated result data is generated at the adder output. The entire process may consume just one precharge/validate cycle, but the ability to instantly hold a latched state of any unit, and to scan that state out, permits observation of all stages in such a device (which could not be achieved in an equivalent manner using conventional logic).

We claim:

1. A basic differential cascode voltage switch (DCVS) tree construct, from which a variety of logical devices can be formed, comprising:

discretely separate logic and load sections, each containing one or more pairs of differentially associated active gating elements; and a pair of isolation gating elements positioned between said sections for permitting elements in the logic section to be operated electrically in isolated relation to the load section.

2. A DCVS tree construct in accordance with claim 1 including: a set of gating elements associated with said logic section for permitting circuits in that section to be precharged while that section is electrically isolated from the respective load section.

3. A DCVS tree construct in accordance with claim 1 including: a set of gating elements associated with said load section for permitting said load section to be operated electrically to receive and latch signals originating from a source other than the respective said logic section.

4. A DCVS tree construct in accordance with claim 3 in which said load section is configurable to be operated electrically as a bit latching circuit that operates either isolated from or directly coupled to the respective logic section; and in which said load section is operable to receive and latch signals originating other than in the respective logic section when isolated therefrom, and said load section operates to latch signals generated by said respective logic section when directly coupled thereto.

5. A differential cascode voltage switch (DCVS) circuit comprising:

multiple uniformly arrayed DCVS tree units electrically interconnectable to form a coherently operable logical device, each said tree unit containing interconnectable logic and load circuit sections; wherein the load section in at least one of said units is configured to be operable as a latching circuit relative to signals originating external to the respective logic section in the same unit.

6. A DCVS circuit in accordance with claim 5 wherein said load section in said at least one of said tree units is configurable specifically to operate as a shift register latch circuit.

7. A DCVS circuit in accordance with claim 5 wherein said load section in said at least one tree unit is configurable dynamically to act as a load buffering element relative to the logic section in the same unit and as a register-latch circuit relative to signals originating external to the respective unit.

8. A differential cascode voltage switch (DCVS) logic circuit comprising multiple DCVS tree circuits, each tree circuit configurable to perform an elementary portion of a complex logic function performed by said logic circuit, wherein said logic circuit is characterized in that:

each of said tree circuits integrally contains circuit means for statically latching its logical output state, and for making signals representing that state observable for diagnostic purposes; said circuit means in each said tree circuit serving during normal operation of the respective tree circuit as a load circuit interfacing between the respective tree circuit and inputs of other tree circuits in said logic circuit; said circuit transiently developing signals representing logical outputs of the respective tree circuit for presentation as logical input signals to said other tree circuits to which said load circuit interfaces.

9. A differential cascode voltage switch (DCVS) circuit comprising:

multiple DCVS tree units configured for operation at different times in distinctly different first and second modes in response to first and second control signals respectively associated with said modes;

each said unit being responsive to said first control signals to receive one or more binary-valued input data signals and immediately generate a binary-valued output data signal representing a discrete logical function of the input signals; and each said unit being responsive to said second control signals to receive only a single binary-valued input data signal and latch that signal for delayed presentation as an output data signal to another one of said units.

10. A differential cascode voltage switch (DCVS) circuit comprising:

multiple DCVS tree units dynamically configurable for operating at different times in distinctly different normal and testing modes;

each said unit when configured for operating in said normal mode being operable to receive one or more binary-valued input data signals from a circuit external to the respective unit and immediately generate a binary-valued output data signal representing a discrete logical function of the input signals; and each said unit when configured for operation in said testing mode being operable to receive only a single binary-valued input data signal from a single other one of said units and to latch that signal as a binary-valued output data signal subject to delayed transfer to another single one of said units.

11. A method of constructing differential cascode voltage switch (DCVS) circuits comprising:

forming a uniform array of multipurpose DCVS tree units, each unit containing electrically isolatable logic and load circuit sections, and forming electrical connections between said tree units, and between said unit sections, to configure said units into a coherently functioning logical circuit entity wherein logic signals are processable in logic sections of some or all of said units and storable as discretely latched signal functions in load sections of some of said units.

12. The method of claim 11 including:

configuring each said tree unit to be able to statically latch a signal representing a transient logic state of the respective unit, whereby said latched signal can be made available for diagnostic observation.

* * * * *